(12) United States Patent
Williams et al.

(10) Patent No.: US 11,525,879 B2
(45) Date of Patent: Dec. 13, 2022

(54) METHODS AND SYSTEMS FOR J-COUPLED NUCLEAR MAGNETIC RESONANCE

(71) Applicant: Triad National Security, LLC, Los Alamos, NM (US)

(72) Inventors: Robert F. Williams, Los Alamos, NM (US); Michelle A. Espy, Los Alamos, NM (US); Derrick C. Kaseman, Los Alamos, NM (US); Jacob Luther Yoder, Los Alamos, NM (US); Per Erik Magnelind, Los Alamos, NM (US); Algis V. Urbaitis, Los Alamos, NM (US); Michael Timothy Janicke, Los Alamos, NM (US); Ryszard Michalczyk, Los Alamos, NM (US); Jurgen G. Schmidt, Los Alamos, NM (US); Pulak Nath, Los Alamos, NM (US); Scarlett Widgeon Paisner, Los Alamos, NM (US); Tammie Renee Nelson, Los Alamos, NM (US)

(73) Assignee: Triad National Security, LLC, Los Alamos, NM (US)

(*) Notice: Subject to any disclaimer, the term of this patent is extended or adjusted under 35 U.S.C. 154(b) by 57 days.

(21) Appl. No.: 16/806,862

(22) Filed: Mar. 2, 2020

(65) Prior Publication Data
US 2020/0355770 A1    Nov. 12, 2020

Related U.S. Application Data

(60) Provisional application No. 62/812,422, filed on Mar. 1, 2019.

(51) Int. Cl.
| | | |
|---|---|---|
| G01R 33/44 | (2006.01) |
| G01R 33/30 | (2006.01) |
| G01R 33/34 | (2006.01) |
| G01R 33/38 | (2006.01) |

(52) U.S. Cl.
CPC ......... G01R 33/445 (2013.01); G01R 33/302 (2013.01); G01R 33/34092 (2013.01); G01R 33/3808 (2013.01)

(58) Field of Classification Search
CPC ............ G01R 33/302; G01R 33/34092; G01R 33/3808; G01R 33/445
See application file for complete search history.

(56) References Cited

U.S. PATENT DOCUMENTS

| | | | |
|---|---|---|---|
| 7,541,806 B2 | 6/2009 | Appelt et al. | |
| 9,046,493 B2* | 6/2015 | Neely | C12Q 1/6816 |
| 2010/0264921 A1* | 10/2010 | Horng | G01R 33/4824 324/309 |

(Continued)

OTHER PUBLICATIONS

Hunter "Earth's Field Spectroscopy" 2012; Annual Reports on NMR Spectroscopy; vol. 76; Chapter 4; pp. 139-164.

(Continued)

*Primary Examiner* — Gregory H Curran

(57) ABSTRACT

A nuclear magnetic resonance (NMR) system is configured to detect combinatorial signatures stemming from homonuclear and heteronuclear J-couplings. The system comprises a pre-polarization system, a detector, and NMR electronics, wherein the detector includes an NMR magnet with a magnetic field of strength between 300 mT and 10 µT.

15 Claims, 12 Drawing Sheets

(56) References Cited

U.S. PATENT DOCUMENTS

2012/0176130 A1* 7/2012 Ledbetter ............... G01R 33/26
                                                          324/301

OTHER PUBLICATIONS

Zhang, et al. "Liquid state nuclear magnetic resonance at low fields using a nitrogen cooled superconducting quantum interference device" 2007; Applied Physics Letters; vol. 90; 3 pages.

Qiu, et al. "Nuclear magnetic resonance in the earth's magnetic field using a nitrogen-cooled superconducting quantum interference device" 2007; Applied Physics Letters; vol. 91; 3 pages.

Burghoff, et al. "Nuclear magnetic resonance in the nanoTesla range" 2005; Applied Physics Letters; vol. 87; 3 pages.

Chizhik, et al. "NMR in Magnetic Field of the Earth: Pre-Polarization of Nuclei with Alternating Magnetic Field" 2014; Applied Magnetic Resonance; vol. 45; pp. 641-651.

Callaghan, et al. "New Zealand Developments in Earth's Field NMR" 2007; Applied Magnetic Resonance; vol. 32; pp. 63-74.

Balci, et al. "Development of Earth's Field Nuclear Magnetic Resonance (EFNMR) Technique for Applications in Security Scanning Devices" 2016; Applied Magnetic Resonance; vol. 47; pp. 87-99.

Singh, et al. "NMR spectroscopy with compact instruments" 2016; Trends in Analytical Chemistry; vol. 83; pp. 12-26.

Liao, et al. "Sensitive J-coupling spectroscopy using high-Tc superconducting quantum interference devices in magnetic fields as low as microteslas" 2009; Superconductor Science and Technology; vol. 22; 4 pages.

Buckenmaier, et al. "SQUID-based detection of ultra-low-field multinuclear NMR of substances hyperpolarized using signal amplification by reversible exchange" 2017; Scientific Reports; 9 pages.

Mcdermott, et al. "Liquid-State NMR and Scalar Couplings in Microtesla Magnetic Fields" 2002; Science; vol. 295; pp. 2247-2249.

Liao, et al. "A study of J-coupling spectroscopy using the Earth's field nuclear magnetic resonance inside a laboratory" 2010; Review of Scientific Instruments; vol. 81; 6 pages.

Appelt, et al. "Mobile High Resolution Xenon Nuclear Magnetic Resonance Spectroscopy in the Earth's Magnetic Field" 2005; Physical Review Letters; vol. 94; 4 pages.

Appelt, et al. "Paths from weak to strong coupling in NMR" 2010; Physical Review; vol. 81; 11 pages.

Appelt, et al. "Phenomena in J-coupled nuclear magnetic resonance spectroscopy in low magnetic fields" 2007 Physical Review; vol. 76; 11 pages.

Bene "Nucler Magnetism of Liquid Systems in the Earth Field Range" 1980; Physics Reports (Review Section of Physics Letters); vol. 58; No. 4; pp. 213-267.

Mohoric, et al. "NMR in the Earth's magnetic field" 2009; Progress in Nuclear Magnetic Resonance Spectroscopy; vol. 54; pp. 166-182.

Appelt, et al. "Chemical analysis by ultrahigh-resolution nuclear magnetic resonance in the Earth's magnetic field" 2006; Nature Physics; vol. 2; pp. 105-109.

Trahms, et al. "NMR at very low fields" 2010; Magnetic Resonance Imaging; vol. 28; pp. 1244-1250.

Wang, et al. "Detection of nuclear magnetic resonance in the microtesla range using a high Tc dc-SQUID" 2012 Journal of Physics: Conference Series; vol. 400; 4 pages.

Trabesinger, et al. "SQUID-Detected Liquid State NMR in Microtesla Fields" 2004; Journal of Physical Chemistry; vol. 108; pp. 957-963.

Shim, et al. "Two-dimensional NMR spectroscopy of 13C methanol at less than 5 uT" 2014; Journal of Magnetic Resonance; vol. 246; pp. 4-8.

Robinson, et al. "Two-dimensional NMR spectroscopy in Earth's magnetic field" 2006; Journal of Magnetic Resonance; vol. 182; pp. 343-347.

Katz, et al. "Earth field NMR with chemical shift spectral resolution: Theory and proof of concept" 2012; Journal of Magnetic Resonance; vol. 219; pp. 13-24.

Hamans, et al. "NMR at earth's magnetic field using para-hydrogen induced polarization" 2011; Journal of Magnetic Resonance; vol. 212; pp. 224-228.

Halse, et al. "Quantitative analysis of Earth's field NMR spectra of strongly-coupled heteronuclear systems" 2009 Journal of Magnetic Resonance; vol. 2oo; pp. 88-94.

Halse, et al. "A dynamic nuclear polarization strategy for multi-dimensional Earth's field NMR spectroscopy" 2008 Journal of Magnetic Resonance; vol. 195; pp. 162-168.

Mcdermott, et al. "SQUID-Detected Magnetic Resonance Imaging in Microtesla Magnetic Fields" 2004; Journal of Low Temperature Physics; vol. 135; Nos. 5/6; 29 pages.

Kang, et al. "Application of the double relaxation oscillation superconducting quantum interference device sensor to micro-tesla 1H nuclear magnetic resonance experiments" 2011; Journal of Applied Physics; vol. 110; 9 pages.

Bevilacqua, et al. "Microtesla NMR J-coupling spectroscopy with an unshielded atomic magnetometer" 2016; Journal of Magnetic Resonance; vol. 263; pp. 65-70.

Bernarding, et al. "J-Coupling Nuclear Magnetic Resonance Spectroscopy of Liquids in nT Fields" 2006; Journal of American Chemical Society; vol. 128; pp. 714-715.

Liao, et al. "Microtesla NMR and High Resolution MR Imaging Using High-Tc SQUIDs" 2013; IEEE Transactions on Applied Superconductivity; vol. 23; No. 3; 4 pages.

Halse, et al. "Terrestrial Magnetic Field NMR: Recent Advances" 2007; Victoria University of Wellington—Previously published in the Encyclopedia of Magnetic Resonance in 2007; 6 pages.

Long-Qing, et al. "Time-Domain Frequency Correction Method for Averaging Low-Field NMR Signals Acquired in Urban Laboratory Environment" 2012; Chinese Physics Letters; vol. 29; No. 10; 4 pages.

Appelt, et al. "Analysis of molecular structures by homo- and hetero-nuclear J-coupled NMR in ultra-low field" 2007; Chemical Physics Letters; vol. 440; pp. 308-312.

* cited by examiner

| Group | J (Hz) | High Field Limit (Regime i) | Low field Limit (Regime ii) | Ultra-Low Field Limit (Regime iii) |
|---|---|---|---|---|
| P-F | 1000 | 438 mT | 13.4 µT | 438 nT |
| P-OCH₃ | 8 | 25.2 µT | 101 nT | 25.3 nT |
| P-CH₃ | 20 | 158 µT | 253 nT | 55.3 nT |
| F-OCH₃ | 0.5 | 1 µT | 341 nT | 89 nT |
| F-CH₃ | 5 | 100 µT | 3.4 µT | 282 nT |

FIG. 1B

| Molecule | Theory | Experimental | | | Simulated | |
|---|---|---|---|---|---|---|
| | | Raw | Q-Corrected | Q+$\omega_0$-Corrected | Raw | $\omega_0$-Corrected |
| Mono- | 83.3 | 84.1 | 88 | 86.6 | 84.6 | 83 |
| 1,2 Di- | 66.7 | 58.2 | 65.7 | 63.3 | 69.3 | 66.6 |
| 1,3 Di- | 66.7 | 62.7 | 70.2 | 67.7 | 69.3 | 66.7 |
| 1,4 Di- | 66.7 | 56 | 65.9 | 63.2 | 69.2 | 66.5 |
| 1,2,4 Tri- | 50 | 52.2 | 60.5 | 57.5 | 53.1 | 50.1 |
| 1,2,4,5 Tetra- | 33.3 | 23.8 | 30.4 | 27.9 | 35.8 | 33.7 |
| Penta- | 16.7 | 14.4 | 17.2 | 17.2 | 18.8 | 17 |

FIG. 8

METHODS AND SYSTEMS FOR J-COUPLED NUCLEAR MAGNETIC RESONANCE

RELATED APPLICATIONS

This non-provisional application claims the benefit of priority in U.S. provisional application No. 62/812,422, filed Mar. 1, 2019, and titled "J-COUPLED NUCLEAR MAGNETIC RESONANCE," the entire content of which is incorporated herein by reference.

Moreover, this application is related to the concurrently filed U.S. Patent Applications titled "METHODS AND SYSTEMS FOR LOW TO ULTRA-LOW MAGNETIC FIELD NUCLEAR MAGNETIC RESONANCE FOR DETECTING CHEMICAL NERVE AGENT" of U.S. application Ser. No. 16/806,954 filed on Mar. 2, 2020, which was issued on May 24, 2022 as a U.S. Pat. No. 11,340,181 the entire content of which is incorporated herein by reference.

FEDERALLY SPONSORED RESEARCH OR DEVELOPMENT

The United States government has rights in this invention pursuant to Contract No. 89233218CNA000001 between the United States Department of Energy (DOE), the National Nuclear Security Administration (NNSA), and Triad National Security, LLC for the operation of Los Alamos National Laboratory.

TECHNICAL FIELD

The present disclosure relates generally to NMR and in particular to J-coupled NMR.

BACKGROUND

Toxic chemicals and biologic materials have been used as weapons since the dawn of civilization. In the past ninety years, chemical agents have been successfully made more lethal, harder to destroy, and easier to obtain and use. Thousands of chemicals can potentially be chemical warfare agents (CWAs) and used as weapons of mass destruction (WMDs).

BRIEF DESCRIPTION OF DRAWINGS

The drawings are not necessarily to scale or exhaustive. Instead, emphasis is generally placed upon illustrating the principles of the embodiments described herein. The accompanying drawings, which are incorporated in this specification and constitute a part of it, illustrate several embodiments consistent with the disclosure. Together with the description, the drawings serve to explain the principles of the disclosure.

In the drawings:

FIG. 1B shows a table listing for each bonds the value of the J-coupling and the values of magnetic field limits of the three regimes.

FIG. 8 shows a table, which depicts the quantitation of different-fluorobenzene compounds according to some embodiments.

DETAILED DESCRIPTION

Figure 1A:
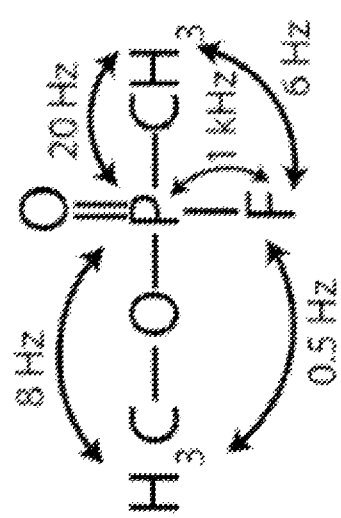
FIG. 1A shows the structure of methyl methyl-fluorophosphonate.

The following detailed description refers to the accompanying drawings. The same or similar reference numbers may be used in the drawings or in the description to refer to the same or similar parts. Also, similarly named elements may perform similar functions and may be similarly designed, unless specified otherwise. Details are set forth to provide an understanding of the exemplary embodiments. Embodiments, e.g., alternative embodiments, may be practiced without some of these details. In other instances, well known techniques, procedures, and components have not been described in detail to avoid obscuring the described embodiments.

While several exemplary embodiments and features are described here, modifications, adaptations, and other implementations may be possible, without departing from the spirit and scope of the embodiments. Accordingly, unless explicitly stated otherwise, the descriptions relate to one or more embodiments and should not be construed to limit the embodiments as a whole. This is true regardless of whether or not the disclosure states that a feature is related to "a," "the," "one," "one or more," "some," or "various" embodiments. Instead, the proper scope of the embodiments is defined by the appended claims. Further, stating that a feature may exist indicates that the feature may exist in one or more embodiments.

In this disclosure, the terms "include," "comprise," "contain," and "have," when used after a set or a system, mean an open inclusion and do not exclude addition of other, non-enumerated, members to the set or to the system. Further, unless stated otherwise or deducted otherwise from the context, the conjunction "or," if used, is not exclusive, but is instead inclusive to mean and/or. Moreover, if these terms are used, a subset of a set may include one or more than one, including all, members of the set.

Further, if used in this disclosure, a first variable is an increasing function of a second variable if the first variable does not decrease and instead generally increases when the second variable increases. On the other hand, a first variable is a decreasing function of a second variable if the first variable does not increase and instead generally decreases when the second variable increases. In some embodiment, a first variable is an increasing or a decreasing function of a second variable if, respectively, the first variable is directly or inversely proportional to the second variable.

The present disclosure provides systems and methods for detecting chemical compositions using mT-µT nuclear magnetic resonance (NMR). In this range of magnetic fields, the molecules' spin system may be in one or more of the following three regimes: (i) high field weak coupling limit, (ii) low field strong coupling limit, and (iii) ultra-low field strong coupling limit. The magnetic field ($B_0$) for the distinct regimes i-iii are respectively given by formulas (1)-(3).

$$B_0 > \frac{J^2}{2\Delta v(\gamma_I - \gamma_S)} \quad (1)$$

$$B_0 > \frac{4J}{(7\gamma_I - \gamma_S)} \quad (2)$$

$$B_0 > \sqrt{\frac{2\Delta vJ}{(\gamma_I - \gamma_S)^2}} \quad (3)$$

where J is the heteronuclear J-coupling between spin active nuclei I and S, $\Delta v$ is the linewidth that is a complex term from the magnetic field inhomogeneity of the system and relaxation of the molecules in the sample, and $\gamma$ is the gyromagnetic ratio of the nuclear spins. As such, the magnetic field may be fixed, but J, $\Delta v$, and $\gamma$, are sample and spin system dependent.

FIG. 1A and FIG. 1B illustrate the above concepts according to one embodiment. In particular, FIG. 1A shows the structure of methyl methyl-fluorophosphonate, a chemical warfare agent. The arrows denote the approximate J-couplings between different heteronuclei, P, F, and H. The magnitude of the J-coupling is inherently tied to the structure of the molecule. The value and sign of the J-coupling may be modified by the bond length, angle, number of bonds, type of bonds, bond angle, and/or element. The methyl methylphosphonoflouridate molecule in FIG. 1A consists of 100% naturally abundant NMR active isotopes of P, F, and H nuclei. The C and O atoms are usually ignored because their NMR active isotopes are only 1.1% and 0.38% naturally abundant, respectively.

FIG. 1B shows a table listing for each bonds the value of the J-coupling and the values of magnetic field limits of the three regimes. For example, if the instruments field is fixed at 10 µT, and $\Delta v$=0.05 Hz, then each of the defined heteronuclear spin subsystems will be in the regime shown in underlined bold in the table of FIG. 1B. That is, in particular, the F—OCH$_3$ bond will in first regime (regime (i)); P—OCH$_3$, P—CH$_3$ and F—CH$_3$ will be in the second regime (regime ii); and P—F will be in the third regime (regime iii).

The coupling regime in which the spin system falls has important ramifications for the type of spectra that are acquired. Namely, the selection rules and energy levels that govern the observable transition frequencies are modified leading to additional peaks corresponding to both heteronuclear and homonuclear couplings. Therefore, based on the J-couplings, spin subsystems, and the measurement magnetic field, the spectra will be unique to the molecule and this holds for all heteronuclear coupled systems, outside of the previously described $X_M$-A-B—$X_K$ systems. In at least some examples, the chemical compositions may be chemical warfare agents (CWAs).

An aspect of the present disclosure relates to a portable NMR system configured to identify CWAs and their attributes. As explained below, there are several aspects to the design of the portable NMR system; (i) the prepolarization system, (ii) the measurement field system, (iii) the sample shuttling system, (iv) the excitation coil, and (v) the detection circuit. The unique signatures that may be detected using a low to ultra-low (LULF) field portable NMR system of the present disclosure include heteronuclear J-couplings, multinuclear acquisitions, relaxation times, and may also include homonuclear J-couplings. The unique signatures arising from homonuclear and heteronuclear J-coupling are characteristic of neighboring or adjacent nuclei (up to nine bonds removed from one nucleus) in chemical compounds. These signatures may be of any chemical structure in which heteronuclear couplings are present, including but not limited to the previously described $X_M$-A-B—$X_K$ systems. The J-coupled values are constant and independent of the magnetic field. Therefore, J-coupling constants of CWAs, their precursors, and products of degradation, as well as classical NMR signatures of relaxation, spin density, and chemical shift may be measured at LULF magnetic fields such as Earth's magnetic field (~50 µT). Individually, each of these signatures may be limited in identifying the structure of a particular chemical compound; but, a combination of multimodal NMR-based signatures is beneficial in the detection space spanning length scales from chemical bonds, molecular structure, to fluid properties and allows the determination of chemical structure of the compound.

The structure of a sample may be determined through database lookup, by ab initio computational comparisons, and/or by determining the specific LULF signature itself. Rather than a threat-by-threat data interrogation, this may result in classification of the entire threat space with structural identification and attribution of threat agents. Teachings of the present disclosure may rapidly identify materials at points of use, or after the materials have been deployed, thereby mitigating national security and global threats, and assisting in determining environmental remediation actions.

The present disclosure provides systems and methods for detecting chemical compositions using LULF magnetic field nuclear magnetic resonance (NMR). In some embodiments, "LULF" refers to 1 nanoTesla to about 300 mTesla magnetic field strengths. In at least some embodiments, the chemical compositions may be CWAs. CWAs include organophosphorus compounds that include P—F/P—H, P(=O), P—N, P—S, and/or P—C bonds, but have variable side chains and chemical moieties including but not limited to P—O—R, P—N—R, and P—S—R, where R may be a side chain such as an alkyl, aryl, vinyl, and related compositions as understood by those skilled in the art.

NMR spectroscopy may be used to determine the content and purity of a sample, as well as the sample's molecular structure. NMR quantitatively measures the processional frequencies of net magnetic moments for nuclear isotopes.

Generally, a sample is placed in an external magnetic field (generally referred to as the polarization field) and the nuclear spins from the atoms in the sample align with the external field. Due to small differences between spin-up and spin-down quantum states, there is a net magnetic moment aligned with the magnetic field. Perturbing the net magnetic moment using radio frequency pulses (generally referred to as the excitation field) results in detectable magnetization at specific frequencies according to the NMR-active isotopes in the material being examined. These frequencies are measured and used to determine the relative amount of each isotope based on signal intensity and the molecular structure based on differences in frequency.

J-coupling may be observed in NMR spectra. J-coupling appears as peaks in NMR spectra due to through-bond interactions between nuclear spins of NMR-active nuclei, such as hydrogen, phosphorus, fluorine, carbon, nitrogen, etc. J-coupling provides information regarding relative bond distances, angles, and atomic multiplicity (peak splitting varies based on the number of nuclei coupled to each other)

that often extends through at least four bonds but in some cases can extend beyond 9 bonds.

In some embodiments, the J-coupling magnitude is magnetic field independent. Therefore, J-couplings can be detected using LULF magnetic field measurements and validated at other magnetic fields, including Earth's magnetic field (50 µTesla) and fields generated by superconducting magnets, e.g. >300 MHz. Homonuclear J-coupling refers to coupling between the same nuclei types (e.g., H—H, F—F) while heteronuclear J-coupling refers to coupling between different atomic types (e.g., P—H, P—F, H—F, C—H or N—H, as some possibilities). Certain aspects of the present disclosure may relate to detection of heteronuclear J-coupling and/or homonuclear J-coupling.

Figure 2:
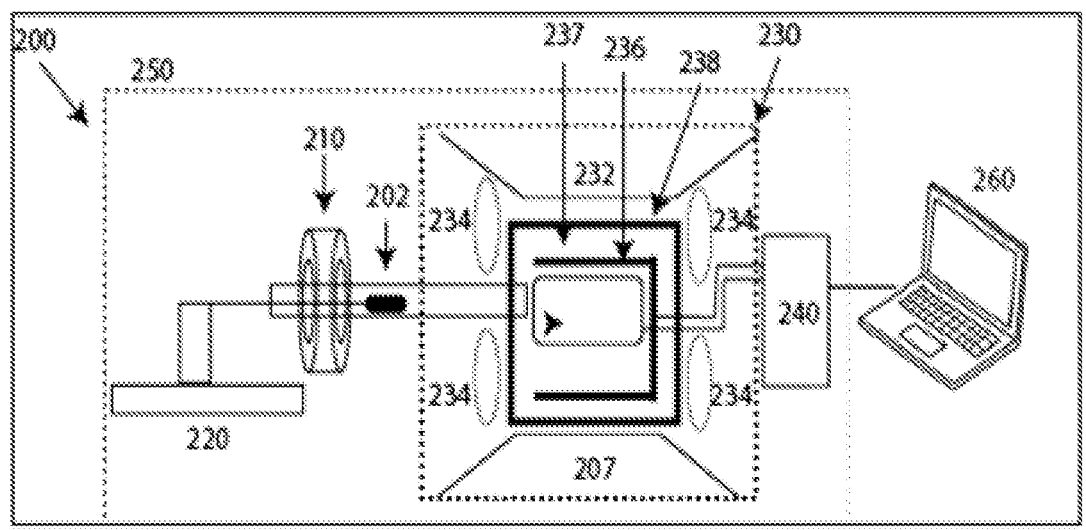
FIG. 2 shows a design of a J-coupled spectrometer system according to some embodiments.

FIG. 2 shows a design of a J-coupled spectrometer system 200 according to some embodiments.

System 200 includes a prepolarization system 210, a shuttling device 220, a detector 230, NMR electronics 240, a housing 250 and a computing device 260 for control and display of spectra.

FIG. 2 also shows a sample 202, on which a spectrum is taken. Sample 202 may be of very small volume (1 nL-1 mL) or concentration (1 µM-110M) contained in either a sample container (such as a standard 5 mm NMR tube or a holder comprised of plastic or glass or similar material as the sample holder or the a tube for a flow system).

Prepolarization system 210 may be a permanent magnet (such as a Halbach array or 4 disc magnets contained in a ½" iron casing, etc.), electromagnet, or a hyperpolarization scheme combining the aforementioned magnet and a hyperpolarizing agent and method (such as parahydrogen, a radical species, a radical species with microwave polarization, laser hyperpolarized Xe gas, etc.).

For a fluidic based system, there may be a prepolarization chamber. In some embodiments, the prepolarization chamber includes an inlet and outlet to allow fluid to flow in an area of prepolarization generated by the prepolarization system magnet chamber. The geometry of the prepolarization chamber may be a reservoir, or a design that allows the fluid to flow through channels between the inlet and outlet.

$O_2$ is paramagnetic and, thus, dissolved oxygen is a source of line broadening and subsequent signal loss. Accordingly, deoxygenating the sample may improve resolution. This can be done using, for example, a membrane filter in a flow system, a vacuum evacuation of dissolved gas, or sparging with an inert gas such as helium or nitrogen. This may in some embodiments be part of the prepolarization chamber and prepolarization system.

Line broadening due to intermolecular interactions can be reduced by heating the sample or by diluting with a deuterated solvent. In some embodiments the heating and dilution may take place in the prepolarization system.

The prepolarization system 210 may use thermal polarization from an external magnetic source or a hyperpolarization method. The pre-polarization system may be operated at a low or a high magnetic field. In some embodiments, the pre-polarization system may be a magnet operated at about 1 Tesla.

In some embodiments, the pre-polarization system may include a permanent magnet having a bore of variable size, for example, a bore size of 15 mm.

Sample shuttling system 220 may be fluidic, pneumatic, mechanical, or gravitational. In some embodiments, it may include a linear actuator, a system of fluid pumps, a pneumatic device, or a peristaltic pump.

In some embodiments, the sample shuttling system provides reliable transportation (defined as sub-mm precision for sample placement) in which the sample shuttling time is constant and repeatable. In some embodiments, such as a fluid based system, this constant but repeatable shuttling may result in a steady-state pre-polarized sample.

Detector 230 includes an NMR magnet 232, a shimming system 234, an excitation coil 236, a detection coil 237, and detector shield 238.

NMR magnet 232 may include electrocoils in a geometry and size such that a homogenous magnetic field is generated over the measured sample volume. Alternatively, the NMR magnet may include earth's magnetic field, a permanent magnet, or a superconducting magnet. In at least some examples, electromagnets may be used, in addition to Earth's magnetic field, to increase field homogeneity. In at least some embodiments, permanent magnets or electromagnets may replace Earth's magnetic field.

The NMR magnet generates a measurement field. This field may range from 10 µT-300 mT. This field may be, but is not required to be, coincident with Earth's magnetic field.

The NMR magnet may generate a magnetic field corresponding to a LULF magnetic field. For example, the NMR magnet may generate a magnetic field up to about 300 mTesla. In embodiments, the NMR magnet may generate a magnetic field of about 50 µTesla, which is equivalent to Earth's magnetic field.

Shimming system 234 may operate to increase homogeneity of the measurement field over the sample volume. The shimming system may include one or more shim coils, each of which alters the magnetic field for higher homogeneity for at least 1 component of the magnetic field. Shimming may also be accomplished by inserting pieces of metal and/or other permanent magnets, such that the magnetic field generated by the NMR magnet is improved. In some embodiments, the shimming system may include multiple shim coils to shim up to and including 6-order harmonics. In some embodiments, the shimming system achieves a magnetic field homogeneity between 1-100 ppm. In some embodiments, the combination of NMR magnet 232 and shimming system 234 is stable over the course of 1 experiment, which may range from 1 second to 60 seconds.

Excitation coil 236 and detection coil 237 may include radio frequency coils. The radio frequency coils may be configured to specific frequencies for excitation and detection of different nuclei. In some embodiments, these radio frequency coils may be either in a saddle or solenoid geometry.

In some embodiments, detection coil 237 may be a coil with a square cross section. The coil may be wound on a custom former that allows sample 202 to move unhindered between prepolarization system 210 and inside detector 230. The dimensions of the square coil may depend on the sample volume, and may require an excess of 20,000 turns The detection coil and excitation coil 236 may be of a solenoid, saddle, or modified Alderman-Grant coil geometry. Detection coil 237 may be a surface coil or a micro-coil. The detection coil may be located at the center of the magnetic field generated by the NMR magnet, but will likely be located in the position at which the magnetic field generated by the NMR magnet (System 232) and shim system (System 234) is most homogenous over the sample volume.

Detector shield 238 encompasses the excitation coil and the detection coil, and blocks extraneous electronic noise sources by acting as a Faraday cage.

In some embodiments, NMR electronics 240 operates one or more parts of the system, synchronously, serially, or in parallel, such as the prepolarization system, the shuttling device, and the detector 230.

The NMR electronics may power the pre-polarization system, the NMR magnet, the shuttling device, or various parts of the detector, or the shimming system. It may also record detected measurements. In some embodiments, the NMR electronics may operate the detector to detect nuclei commonly found in CWAs.

The NMR electronics may provide RF pulses to the excitation coil to excite nuclear spins in the sample. The detection coil may detect signals generated due to the relaxation of excited nuclei as they precess back to their equilibrium state.

In some embodiments, the NMR electronics operates different parts of the system to detect nuclei such as $^1$H, $^{19}$F, $^{31}$P, etc. In some embodiments, the NMR electronics operates different parts of the system to perform a single measurement to detect $^1$H, $^{19}$F, and $^{31}$P nuclei together. In such cases, the system may be classified as high-throughput screening.

The NMR electronics may convert output received from the detector into a digital representation that provides data to an operator of the system for analysis and interpretation.

NMR electronics 240 may include a tuning capacitor utilized in resonant detection explained below. The NMR electronics may further include a preamplifier, capacitor, and an instrument that can send and receive operational signals.

Various embodiments may utilize various commercially available NMR consoles for the NMR electronics such as representative consoles manufactured by National Instruments, USA and or Techmag, USA, or Pure Devices, GmbH, Germany.

Housing 250 may house one or more parts of system 200, such as prepolarization system 210, shuttling device 220, detector 230, and NMR electronics 240. Housing 250 may not provide magnetic shielding, but may provide additional electronic shielding. In some embodiments, the housing is surrounded, partially or fully, by Mu-metal shielding.

Housing 250 may be selected to provide a lightweight system. Example housing materials include, but are not limited to, metals/alloys such as aluminum or stainless steel, plastics such as polyoxymethylene or polycarbonate, and composites containing glass or carbon fibers.

Housing 250 may have various dimensions. Minimizing the housing dimensions may be limited by the sizes and configuration of the parts that it contains and the sample size to be examined. In some embodiments, housing 250 weighs less than about 20 kg and is less than about 1 m$^3$ in size.

Computing device 260 may be a computer or other electronic device capable of interfacing with the shuttling device, the NMR electronics, the NMR magnet, the shimming system, or the detection system.

In some embodiments, the computing device processes digital outputs of the NMR electronics for purposes of determining whether or not detected samples are CWAs.

System 200 may further include a frequency relay (not illustrated) for multinuclear detection. The frequency relay may be a high frequency relay. Various commercial frequency relays may be used. For example, a frequency relay manufactured by Teledyne Relays, USA, may be used. The frequency relay may switch between different passive electronics or instrument coils to optimize system sensitivity to different nuclei.

The system may also include a pre-amplifier in the NMR electronics. The pre-amplifier may increase the size of small signals coming from the detection coil for optimal observation by the NMR electronics.

System 200 may further include a National Instruments® (National Instruments, Austin, USA) data acquisition (NI-DAQ) board, or equivalent, as part of the NMR electronics. The operation of the NMR electronics may include sending digital signals from the NMR electronics to the shuttling device, relays, or the pre-amplifier. This may include converting the signal from the preamplifier to a digital signal that can be interpreted by the computing device.

Next, some stages of the operation of the system are explained. During the operation of the system, the sample begins in prepolarization system 210. After achieving sufficient polarization, the sample shuttling device 220 transports the sample into detector 230.

At this stage, the NMR magnet 232 generates a measurement field. After reaching the homogeneous magnetic field, the spins in the sample may be excited by a resonant or non-resonant pulse given by excitation coil 236. The excitation coil prepares the spins for detection by detection coil 237. Detection may proceed by either resonant or non-resonant detection. Resonant detection refers to having the tuning capacitor in series with the detection coil to create a tuned circuit. Non-resonant detection occurs when no capacitor is in parallel with the detection coil. During non-resonant detection, the detection coil will have a self-resonance, which may be outside the detection range. Detection may also proceed with a resonant circuit but may be broadband. In this case, the signal of the frequencies in the detection bandwidth of the tuned circuit may be much larger than the signals from frequencies outside this range.

During the operation, NMR electronics 240 may send or receive operational signals to trigger the shuttling device; control timings including pulses, pulse length, relays, and acquisition.

Measurement time may vary and may depend on the magnetic field, sample size, and/or system configuration. In general, as the sample size, sample concentration, the magnetic field for detection, and the prepolarization magnetic fields are increased, the signal increases and reduces the amount of measurement time needed to acquire a signature. Additionally, as the amount of time needed for the sample to traverse between the prepolarization system and the detector is decreased, the signal will be increased, which also decreases the total measurement time.

Some embodiments use a two coil implementation. In the two coil implementation, the system may include an inner detection coil (e.g., the coil closest to the sample) and an outer coil (e.g., a coil further from the sample than the inner coil). In some embodiments, the system may include an excitation saddle coil and a detection solenoid coil. A two coil implementation with excitation and detection performed with each coil enables the system to excite multiple nuclei. In an example, the inner coil may be configured to excite and detect $^1$H, $^{19}$F, $^{31}$P, or other nuclei, while the outer coil would excite and detect a different nucleus. By changing the electronic circuit, for example by using relays to select different tuning frequencies, the system can be selective for different nuclei.

The system may also be configured for broadband excitation via one coil and detection via another coil. In order to optimize the signal of sample, the detection coil may be wrapped with enough turns to optimize the signal, while maintaining the detection bandwidth. The design of the coil is paramount for increasing the signal voltage above the noise floor of the NMR electronics. By increasing the number of turns in the coil, the output voltage may continue to increase, until a square coil geometry is obtained. Past this point, additional coil turns may increase the resistance and decrease the maximum obtainable signal to noise ratio (SNR). Tuning of the circuit may be accomplished using a capacitor, which may be part of the NMR electronics or be contained within the electrical shield. A tuned circuit gives a finite detection bandwidth for the circuit. In some embodiments, this may be achieved with a 20,000 turn solenoid using 40 AWG magnet wire. This results in a Q-factor of ~8, which is sufficient for a detection bandwidth of 250 Hz for a resonance frequency centered at 2,000 Hz. In other cases, broadband detection (>2 kHz) may be performed by not including a capacitor in the NMR electronics and/or performing uniform excitation with the excitation coil. In this case the Q-factor may not relevant, as it is not a tuned circuit and the detection bandwidth is that of the uniform excitation bandwidth. The uniform excitation bandwidth (EBW) is governed by EBW=1/(4*pulse length) for a rectangular pulse. Further increases in SNR may be obtained by using an external high-quality factor coil in which a high Q-factor coil (Q>100) is made and placed in series with the detection coil. This may reduce the overall number of coil turns needed, thereby reducing the overall resistance of the circuit and increasing the SNR. The high Q-factor coil may be constructed using low noise ferrites, such as MN60.

Figure 3:
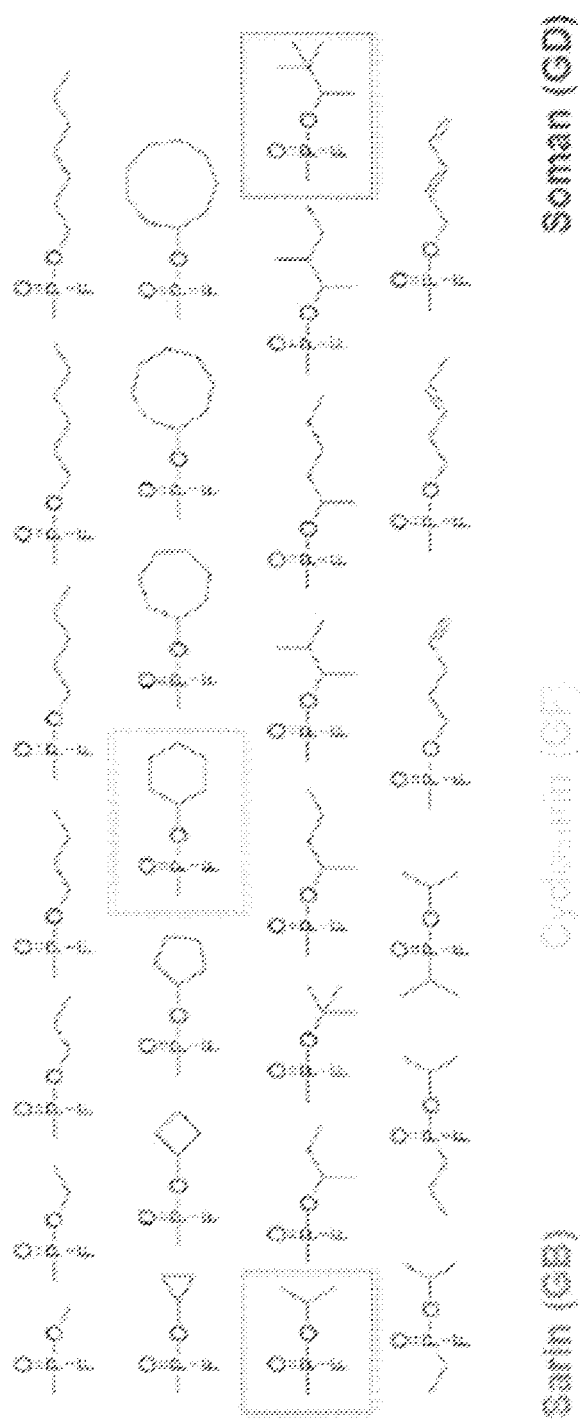
FIG. 3 shows 28 different chemical structures for various CWA's.

FIG. 3 depicts the variability in the structure of chemical warfare agents (CWAs) as detected by some embodiments. In particular, FIG. 3 shows 28 different chemical structures for various CWA's, arranged in four rows. Of these agents, three commonly known CWAs are identified (placed in boxes): Cyclosarin (GF) in the second row; and Sarin (GB) and Soman (GD) in the third row. Various G-nerve agents may include the P—F bond. In each row, from left to right, the organic group bound to the oxygen atom grows larger. This organic group may be a linear chain (row 1), a cyclic structure (row 2), branched (row 3), or contain multiple bonds (row 4, columns 3-6) as well as many other organic moieties. Additionally, the organic group directly bound to the phosphorus atom may also change as illustrated as row 4. Other CWAs that are not G-nerve agents but are other types of CWA nerve agents may also include a cyanide group (CN), or S-containing organic group (V-agents) instead of a fluorine group.

Figure 4:
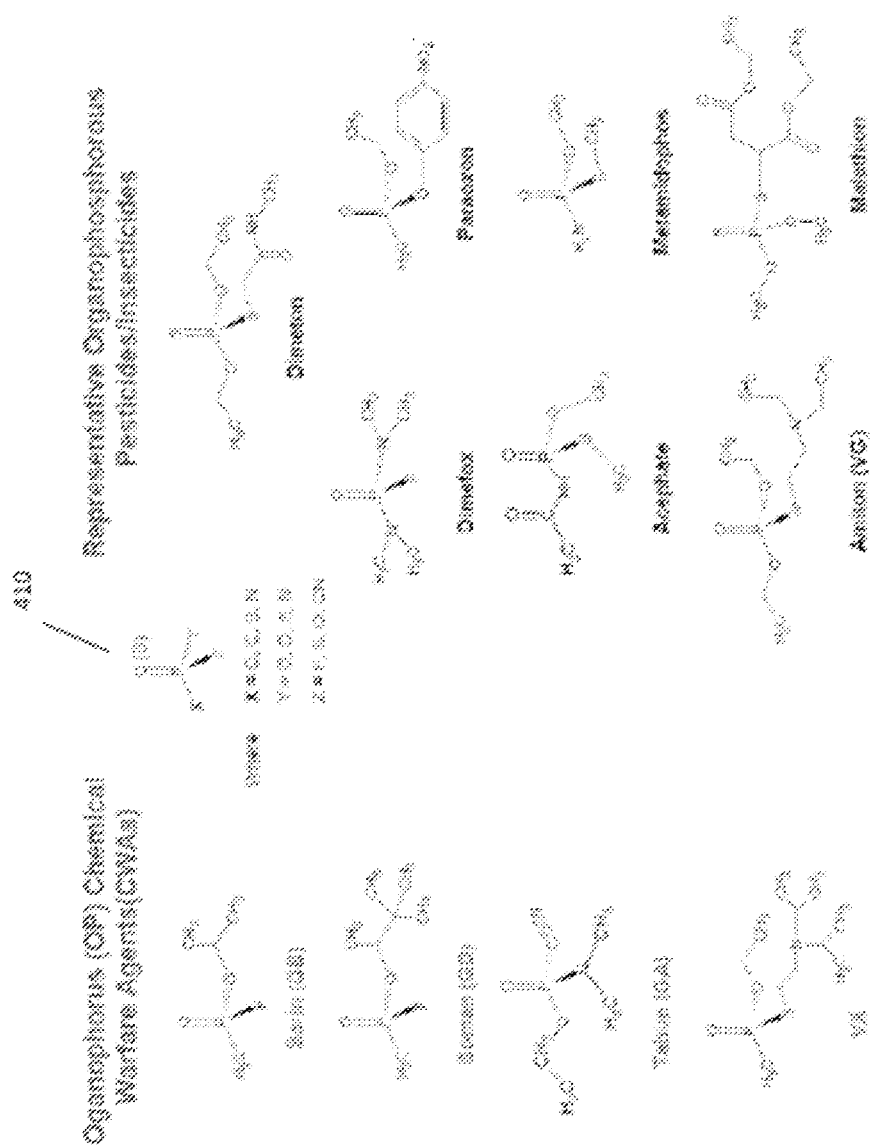
FIG. 4 also depicts the variability of CWA's and their relation to some other chemicals.

FIG. 4 also depicts the variability of CWA's and their relation to some other chemicals. In particular, chemical structure 410 shows the general structure of CWA's according to some embodiments. Structure 410 shows the variability in the number of potential CWAs. Left column shows four CWAs used in practice. The right columns show a few related pesticides and insecticides from a large structural universe, which have structures similar to CWAs in some aspects.

Figure 5:
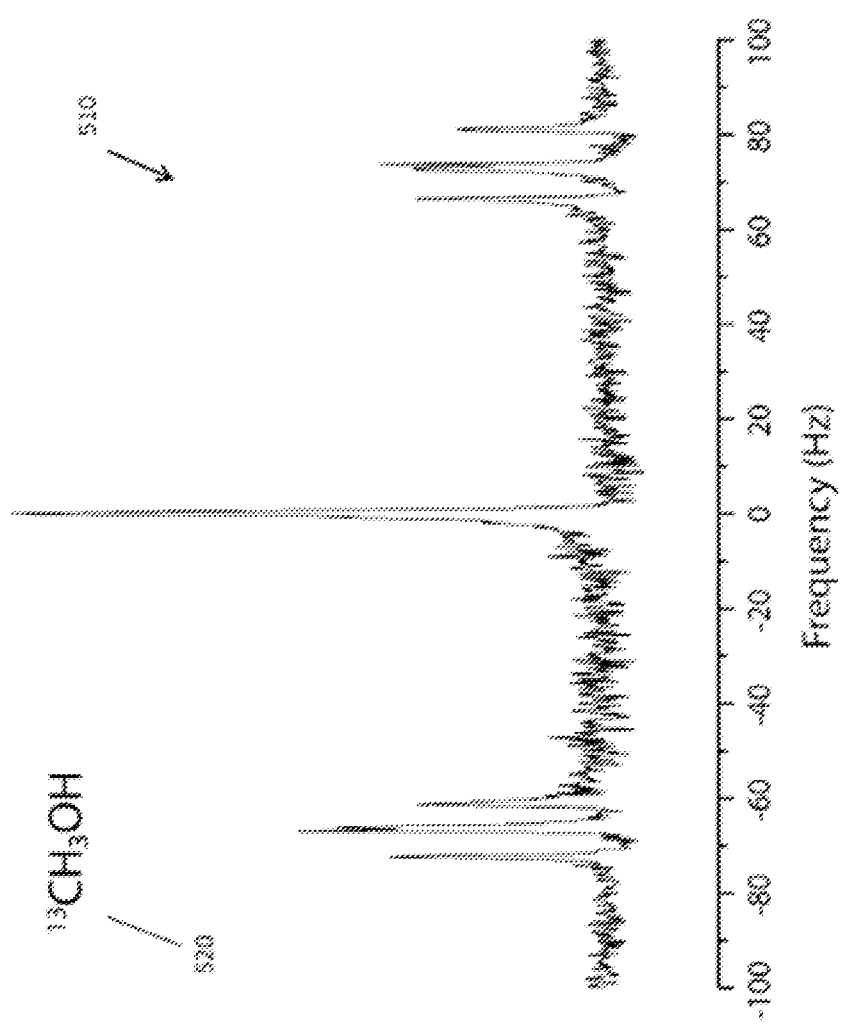
FIG. 5 shows J-coupled spectrum of $^{13}$C-labeled methanol, collected near 50 µT with the J-coupled spectrometer system according to some embodiments.

FIG. 5 shows J-coupled spectrum 510 of $^{13}$C-labeled methanol 520, collected near 50 µT with the J-coupled spectrometer system 200 according to some embodiments. The $^{13}$C—H coupling in compound 520 is 140.5 Hz and therefore, is in the low field strong coupling limit. The peak at 0 Hz, relative to the $^1$H NMR frequency near 2,000 Hz, is due to the H on the OH of methanol. This H atom is rapidly exchanging and is unable to couple to the $^{13}$C atom. On the other hand the other 3H atoms couple to the $^{13}$C atom and the $^1$H spectrum is split by the heteronuclear J-coupling ($^{13}$C to $^1$H). In the high field weak coupling limit, there should only be 2 peaks, separated by the J-coupling value. However, as the spin system of the methanol molecule is in the low field strong coupling limit, spectrum 510 shows that there are 8 heteronuclear J-coupling peaks symmetrically placed around the H signal at 0 Hz.

Figure 6:
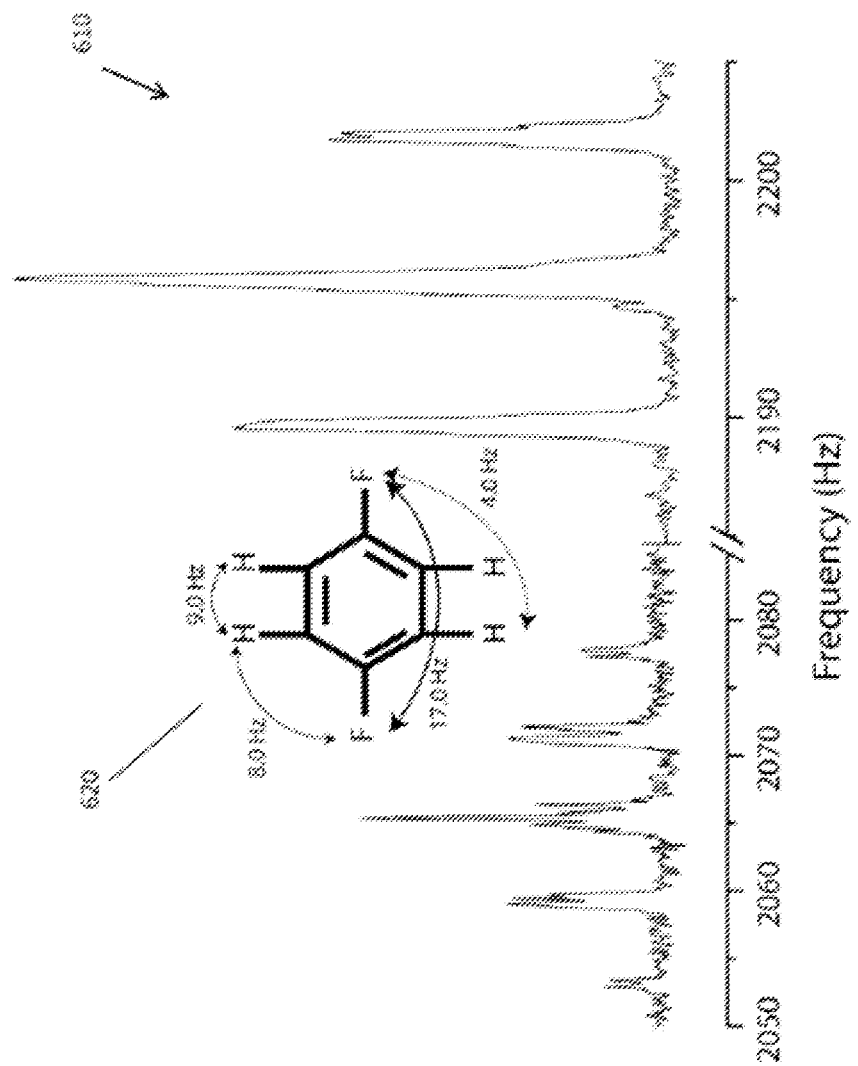
FIG. 6 shows a spectrum of 1,4 difluorobenzene (DFB) according to some embodiments.

FIG. 6 shows a spectrum (labelled 610) of 1,4 difluorobenzene (DFB) (labelled 620) collected at ~50 µT using resonant detection and broadband detection of both $^{19}$F (2050-2085 Hz) and $^1$H (2175-2220 Hz) according to some embodiments. The DFB molecule's approximate J-couplings are shown as double arrows and are in the mixed coupling regime for heteronuclear J-couplings. J >5 Hz is a strongly coupled heteronuclear system, while J<5 is a weakly coupled heteronuclear system. The observed spectrum 610 is reflective of the mixed system and provides additional peaks, compared to results that are obtained at high field (MHz), which show a triplet of triplets (9 peaks) for the $^{19}$F spectrum and a doublet of doublets (4 peaks) for $^1$H.

Figure 7:
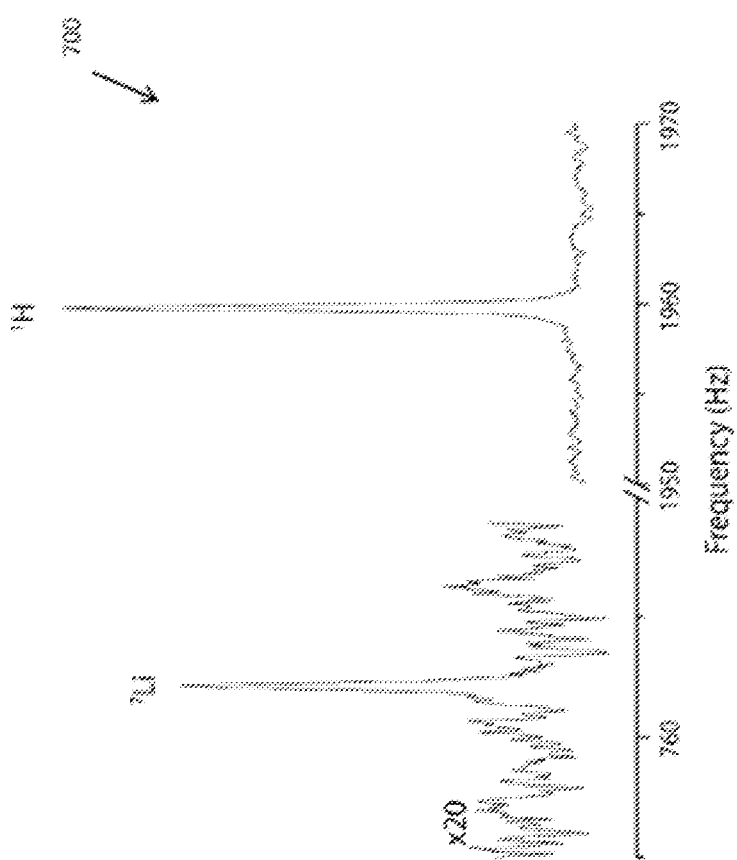
FIG. 7 shows a ~50 µT spectrum of 8M LiCl in $D_2O$, spiked with 20 µL $H_2O$, according to some embodiments.

FIG. 7 shows a ~50 µT spectrum (labelled 700) of 8M LiCl in D$_2$O, spiked with 20 µL H$_2$O, according to some embodiments. Spectrum 700 is demonstrated with broadband excitation and detection using a detection coil tuned to $^1$H, but not $^7$Li. The $^7$Li spectrum is magnified by a factor of 20 to show its spectral features. This demonstrates that signals from other nuclei, such as quadrupolar nuclei (e.g. $^7$Li) may be detected and that broadband excitation and detection is achievable in a single experiment.

In some embodiments, nuclear isotope ratios (corresponding to relative spin density amplitudes and the stoichiometry from the molecular compound) may be used to identify chemical compounds. This may be used, based at least in part, for identifying chemical nerve agents containing P, F, and H nuclei. This measurement technique may be beneficial because it does not require a standard or knowledge of sample volume or sample structure for quantification.

FIG. 8 shows table 800, which depicts the quantitation of different-fluorobenzene compounds according to some embodiments. In table 800, the theory quantity is the percent of hydrogen compared to the percent of F in the molecule. This is dictated by the molecular formula of the particular fluorobenzene molecule. For example in monofluorobenzene (first row) there are 5H and 1 F, resulting in 83% H. The Raw experimental results are the integral areas of the H region of the spectra compared to the integral areas of the F portion of the spectra. The Q-corrected column is the normalization of the Q-factor at each frequency. The Q-factor is based on the specific characteristics of the NMR electronics and the detection coil. In some cases, the Q-correction is such that the $^{19}$F signals are amplified by a factor ~1.3 larger than $^1$H signals. The Q+$\omega^2$ column means that the spectral intensities were normalized by the Q-factor and the frequency squared. As demonstrated by normalizing by both Q and $\omega^2$, close agreement to the theory is achieved. Comparing the simulated spectra, which assumes Q=1 for all frequencies, shows that only a $\omega^2$ correction is required for the spectra to reflect correct theory. The $\omega^2$ correction is needed as the NMR signal is proportional to this factor. This procedure allows a quasi-empirical molecular formula (ratio of $^1$H to $^{19}$F for example) to be determined, in a single experiment.

Figure 9A:
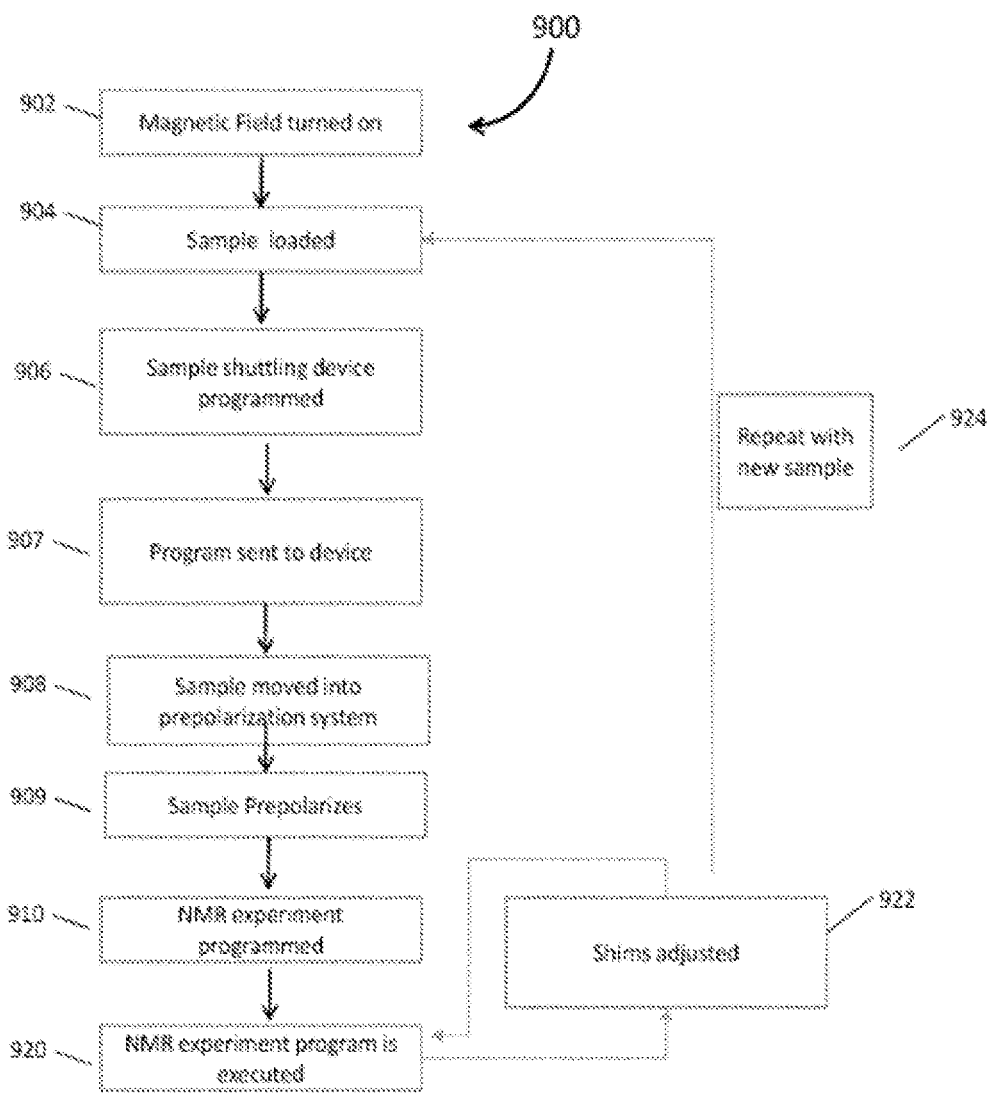
FIGS. 9A and 9B show flowcharts for the operation of a J-coupled spectrometer system according to some experiments.
Figure 9B:
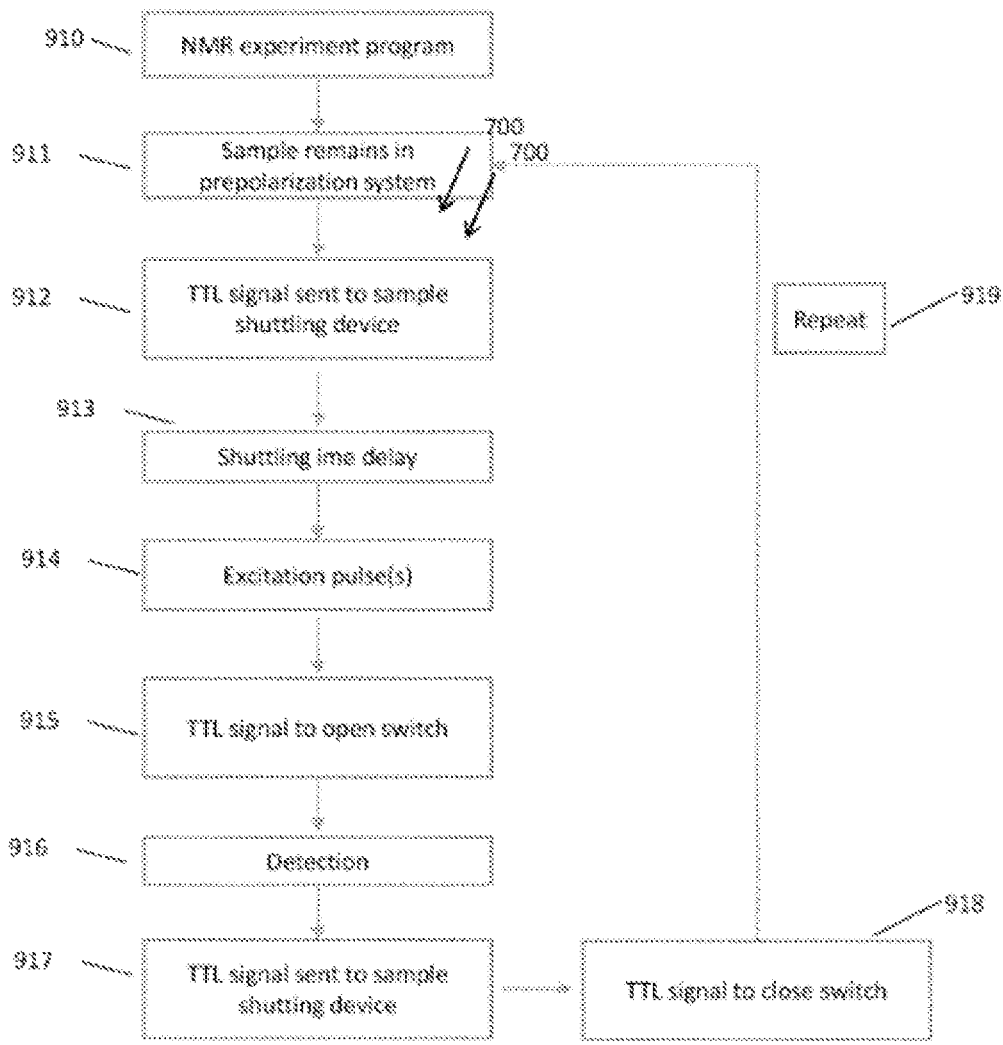

FIGS. 9A and 9B show flowcharts for the operation of a J-coupled spectrometer system according to some experiments.

In step 902 the magnetic field is turned on via the current power supply.

In a step 904, the sample is loaded into sample shutting system.

In step 906 the sample shuttling device is programmed on the computer. In some cases this dictates the speed, acceleration, deceleration, initial and final position of the sample as it is shuttled. In some cases this may dictate the flow rate, number of pumps, and pressures.

In step 907 the shuttling program from step 906 is sent to the shuttling device. In some cases this may be via USB.

In step 908, the sample is moved by the sample shuttling device into the prepolarization system.

In step 909, the sample is prepolarized in the prepolarization system.

In step 910 the NMR experiment is programmed which subsists of steps 911-919.

In step 911 the sample remains in the prepolarization system. This should last for a sufficient time so that the sample reaches polarization, generally denoted as $5*T_1$, where $T_1$ is the spin-lattice relaxation time.

In step 912 a transistor-transistor logic (TTL) signal is sent to the sample shuttling device that allows the program that was sent to the shuttling device in step 907 to be executed. The sample then traverses between the prepolarization system and the detector.

In step 913 a delay is included to account for the time it takes for the sample to travel between the prepolarization system and the detector. This delay also includes the time it takes for the electronics to "quiet down" after the program is executed. This is typically, but not required, to be on the order of 1-1000 ms.

In step 914 the system provides at least 1 excitation pulse. An excitation may be of any shape, power level, phase, frequency, or length that allows excitation of an observable coherence. Multiple pulses may be used. There may be delays between pulses. These delays and pulses may be incremented in a way that multidimensional NMR experiments may be performed.

In step 915 a TTL signal is sent to a switch to toggle it to an "open" configuration. Thereby disconnecting the excitation coil from the circuit.

In step 916 the signal is detected. Signal detection may be at any frequency or phase that allows for detection of the observable coherence generated in step 914.

In step 917 a TTL signal is sent to the sample shuttling device to return the sample to the prepolarization device.

In step 918 a TTL signal is sent to the switch to toggle it to a "closed" position. This reconnects the excitation coil to the circuit.

In step 919 the steps 911-918 may be repeated. Further repetitions will increase the signal to noise ratio.

In step 920 the NMR program developed in steps 911-919 are executed.

In step 922 the signal from the previous experiment is examined. If the linewidth is not optimal, the power supplies controlling the magnetic field in 902 are adjusted. Then steps 920 and 922 are run until the peak linewidth is minimized. Note that in some cases solution of 40% dioxane in $d_6$-Benzene solution may be used. In some embodiments shimming is adjusted until the linewidth is <0.08 Hz.

In step 924 steps 904-920 are repeated with the sample of interest. Note that once the shims are set, step 922 no longer needs to be completed.

Figure 10:
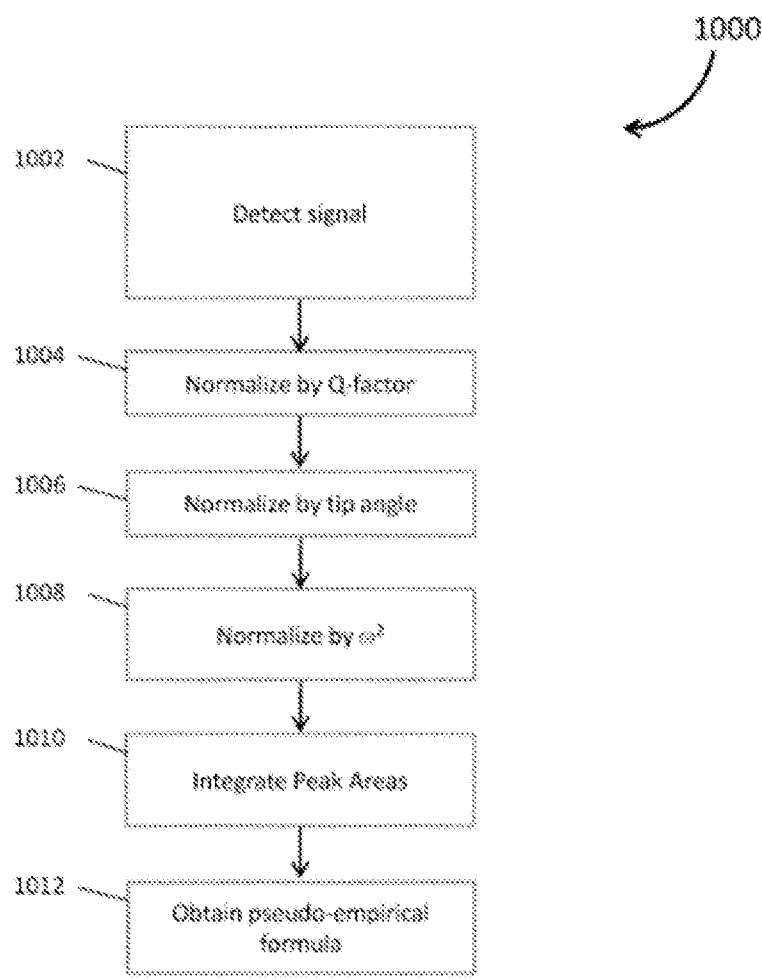
FIG. 10 is a flowchart for deriving a pseudo-empirical formula according to some embodiments.

FIG. 10 is a flowchart 1000 for deriving a pseudo-empirical formula according to some embodiments.

In step 1002, the NMR signals from nuclei are obtained simultaneously. The signal then goes through basic processing steps that may include phasing, Fourier transformation, zero-filling, normalization, and baseline correction.

In step 1004 the signals are normalized by the Q-factor. This may be accomplished by measuring the coil response in the absence of a sample to understand the frequency response of the tuned circuit, if a tuned circuit is used in the detector system and NMR electronics.

In step 1006 the signals are normalized by the tip angle (q) of the pulse. The tip angle refers to the angle relative to the external magnetic field that the nuclear spins are rotated by the pulse. As only the transverse components of the magnetization are detectable, the projection of the magnetization on the transverse plane id used. The projection is given by sin(q).

In step 1008 the signals are normalized by $w^2$. This is because the NMR signal may be directly proportional to $w^2$. Simply using the gyromagnetic ratio (g) May be typically insufficient as the J-Couplings may be of the order of the Zeeman interaction and the resonant frequencies result in significant deviation from a single g value.

In step 1010 the peak areas are integrated and summed for each nucleus. This requires knowledge of which resonances correspond to which nuclei.

In step 1012 a pseudo-empirical formula may be obtained by creating ratios of the integrated areas. It will only contain those species which were measured by the experiment and may not include all nuclei in the molecule. One may also differentiate between different structural motifs in the molecule. This may be accomplished by comparing the integrated areas of separable peaks from different species and obtaining the relative ratios of the spin densities.

Signatures that can be observed using the presently disclosed portable Earth's magnetic field (50 µTesla) NMR system include peak intensity, which can be used for elemental analysis, line shapes, which can be used to extract relaxation times, and peak position and multiplicities which are usable to determine J-couplings. Implementing advanced data acquisition and pulse sequence methods enables relaxation times to be determined as well. Relaxation times are additional signatures for a sample in solution and are indicative of chemical content, molecular weight, and viscosity. Application of 2-dimensional (2-D) NMR methods and advanced pulse sequences are additional methods that increase identification capabilities and provide structural characteristics of organic compounds such as CWA's, thus allowing the identity of a chemical compound being analyzed to be determined.

The foregoing description of the embodiments has been presented for purposes of illustration only. It is not exhaustive and does not limit the embodiments to the precise form disclosed. Those skilled in the art will appreciate from the foregoing description that modifications and variations are possible in light of the above teachings or may be acquired from practicing the embodiments. For example, the described steps need not be performed in the same sequence discussed or with the same degree of separation. Likewise various steps may be omitted, repeated, combined, or performed in parallel, as necessary, to achieve the same or similar objectives. Similarly, the systems described need not necessarily include all parts described in the embodiments, and may also include other parts not described in the embodiments. Accordingly, the embodiments are not limited to the above-described details, but instead are defined by the appended claims in light of their full scope of equivalents.

The invention claimed is:

1. A nuclear magnetic resonance (NMR) system configured to detect combinatorial signatures stemming from homonuclear and heteronuclear J-couplings, the system comprising:
   a pre-polarization system,
   a detector,
   a shuttling device configured to shuttle a sample between the pre-polarization system and the detector using a mechanical linear actuator or a flow-based or micro-fluidic-based device, wherein a shuttling time of the sample between the pre-polarization system and the detector is constant and configured to return the sample to the pre-polarization system for the sample to be re-analyzed by the detector, and wherein the constant shuttling time of the sample between the pre-polarization system and the detector creates a steady-state pre-polarization sample, and NMR electronics, wherein the detector includes an NMR magnet with a magnetic field of strength between 300 mT and 10 µT.

2. The system of claim 1, wherein:

the detector further includes a shimming system configured to increase homogeneity of the magnetic field to values between 1-100 ppm.

3. The system of claim 1, wherein the shuttling device is configured to shuttle the sample in a time interval less than 1 s.

4. The system of claim 1, wherein the detector further includes an excitation coil and a detection coil.

5. The system of claim 4, wherein the excitation coil and the detection coil are radio frequency coils.

6. The system of claim 1, wherein the system is capable of detection for samples larger than 1 nL.

7. The system of claim 1, wherein the system is capable of detection for samples containing different nuclei with concentrations between 110M and 1 µM.

8. The system of claim 1, wherein the system is configured to detect one or more chemical war agents comprising organophosphorus compounds.

9. The system of claim 1, wherein a size of the system is less than 1 cubic meter.

10. The system of claim 1, wherein the system is portable.

11. The system of claim 1, wherein a weight of the system is less than 20 Kg.

12. The system of claim 1, wherein the system is configured to detect molecules with heteronuclear J-couplings of any form, including $X^M$-A-B-$X^k$, such that the heteronuclear J-coupling falls into one or more of the J-coupling regimes.

13. The system of claim 1, wherein the system is configured to provide simultaneous excitation and detection (~3 kHz) of all spin active nuclei in the sample using a uniformly exciting pulse.

14. The system of claim 1, further comprising a resonant circuitry configured for detection.

15. The system of claim 1, further comprising a non-resonant circuitry configured for detection.

* * * * *